United States Patent
Fischer et al.

(10) Patent No.: US 8,512,452 B2
(45) Date of Patent: Aug. 20, 2013

(54) HOT-TRAP ASSEMBLY FOR TRAPPING UNREACTED GAS BY-PRODUCTS

(75) Inventors: Tobias Fischer, Walenstadt (CH); Stefan Schneider, Valens (CH); Hagen Göttlich, Pfäfers (CH); Kavreet Bhangu, Cologne (DE); Benjamin Vogler, Walenstadt (CH); Christoph Widmeier, Zürich (CH); Arno Zindel, Grüsch (CH)

(73) Assignee: Tel Solar AG, Trubbach (CH)

( * ) Notice: Subject to any disclaimer, the term of this patent is extended or adjusted under 35 U.S.C. 154(b) by 53 days.

(21) Appl. No.: 13/059,855

(22) PCT Filed: Jun. 15, 2009

(86) PCT No.: PCT/EP2009/057390
§ 371 (c)(1),
(2), (4) Date: Jul. 7, 2011

(87) PCT Pub. No.: WO2010/020445
PCT Pub. Date: Feb. 25, 2010

(65) Prior Publication Data
US 2011/0252969 A1 Oct. 20, 2011

Related U.S. Application Data

(60) Provisional application No. 61/089,925, filed on Aug. 19, 2008, provisional application No. 61/092,963, filed on Aug. 29, 2008, provisional application No. 61/099,340, filed on Sep. 23, 2008.

(51) Int. Cl.
*B01D 45/00* (2006.01)

(52) U.S. Cl.
USPC ............ 95/272; 55/522; 55/523; 55/482; 55/485; 55/442; 55/434.2; 55/385.2; 55/DIG. 15; 95/288; 96/420

(58) Field of Classification Search
USPC ............ 55/DIG. 15, 522, 523, 482, 484, 55/485, 442, 434.2, 385.2; 118/715; 95/272, 95/288; 96/420; 62/55.5
See application file for complete search history.

(56) References Cited

U.S. PATENT DOCUMENTS

| | | | |
|---|---|---|---|
| 5,213,767 | A | 5/1993 | Smith et al. |
| 6,254,685 | B1 | 7/2001 | Kraft et al. |
| 2003/0037730 | A1 | 2/2003 | Yamasaki et al. |
| 2003/0141016 | A1 | 7/2003 | Okase et al. |
| 2003/0172713 | A1 | 9/2003 | Nomura et al. |
| 2005/0061150 | A1 | 3/2005 | Mardian et al. |

FOREIGN PATENT DOCUMENTS

JP          9-072291 A      3/1997

OTHER PUBLICATIONS

State Intellectual Property Office of the People's Republic of China, Office Action, issued Apr. 12, 2013, eight (8) pages.

*Primary Examiner* — In Suk Bullock
*Assistant Examiner* — Dung H Bui
(74) *Attorney, Agent, or Firm* — Nath, Goldberg & Meyer; Jerald L. Meyer (57) ABSTRACT

The present invention provides a hot-trap device (1) comprising an enclosure (2) with at least one inlet (3), at least one outlet (5) at least one heating means (7) and at least one collector means (10) for the conversion of reaction by-products into products, wherein the collector means is arranged within the enclosure between the inlet and the outlet has a diameter that substantially matches the diameter of the enclosure and has at least one opening (18).

13 Claims, 4 Drawing Sheets

HOT-TRAP ASSEMBLY FOR TRAPPING UNREACTED GAS BY-PRODUCTS

This is a National Phase Application filed under 35 U.S.C. 371 as a national stage of PCT/EP2009/057390, filed Jun. 15, 2009, and claiming the benefit under 35 U.S.C. 119(e) from U.S. Provisional Application No. 61/089,925, filed 19 Aug. 2008, Application No. 61/092,963, filed 29 Aug. 2008, and Application No. 61/099,340, filed 23 Sep. 2008, the content of each of which is hereby incorporated by reference in its entirety.

TECHNICAL FIELD

The present invention relates to the field of hot-traps, devices used in vacuum treatment systems to clean the gases exhausted from the treatment area. Particularly, the present invention discloses novel hot-trap devices comprising collector means for the efficient conversion of reaction by-products. This efficient conversion is inter alia achieved by the geometry, the spacing and the temperature of the collector means.

BACKGROUND ART

Vacuum processing systems are well known in the art and used for a variety of applications, e.g. for the production of thin-film solar cells or TFT displays in the photovoltaic industry or in the display industry, respectively. In general a vacuum processing system comprises a transport path for substrates in a vacuum environment. Along said transport path various processing means (processing stations or modules) may be arranged to act on the substrate, e.g. heating means, cooling means, means for layer deposition by, inter alia, chemical vapor deposition (CVD), means for etching or quality control, and so on. EP 0 575 055 and U.S. Pat. No. 4,358,472 show, so called, inline vacuum processing systems. In general, the modules of the vacuum processing system are separated from each other by valves or gates in order to avoid cross-contamination and the pressure within said modules is set below ambient, i.e. atmospheric pressure by means of vacuum pumps such as fore vacuum pumps or high vacuum pumps.

During the operation of the vacuum processing system, processing gases are fed into the processing environment, e.g. diethyl zinc (DEZ) into a PECVD deposition module. Furthermore, during deposition the process gases are depleted and a permanent flow of fresh process gas is fed into the processing system. At the same time, the vacuum pumps are operated permanently, to keep up the desired process pressure. Consequently, process gas comprising reaction by-products and/or unreacted reagents is continuously evacuated/exhausted from the vacuum processing system.

However, the reaction by-products and/or unreacted reagents tend to aggregate together under conditions prevalent in the module exhaust, the vacuum pump and the equipment piping, which may lead to negative effects on the process efficiency, blockage of the piping and vacuum pumps, reduction of production cycle time and/or the need for frequent cleaning cycles. Especially, the vacuum pumps are affected since the pump increases the local pressure from process pressure up to atmospheric pressure and heats up the gas due to the compression. Both effects result in lead to an increased reaction of the process gases inside the vacuum pump which may lead to metallic or oxidic deposition (e.g. Zn or ZnO from diethyl zinc) which, in turn, result in reduced lifetime of the pumps, a clogging of the vent lines etc. This problem is even more pronounced during production in industrial scale, where high throughput of substrates requires a high consumption of process gases.

In conventional vacuum processing systems a trap is placed upstream of the vacuum pump to clean the exhausted gas from reaction by-products and the unreacted reagents. Hot-traps and cold-traps are known in the art. Cold-traps allow condensation or recombination of gas constituents to remove or inactivate parts of the unused process gases and/or reaction by-products. However, cold-traps will be saturated very fast and may lead to a concentration of a single component in the exhaust stream which might be a health hazard, requiring additional safe handling requirements.

Various designs of hot-traps are known in the art which either use mechanical constrictions in the path of gas flow or an enlarged surface area. These premises are based on the fact that the reaction of components present in the process gas is surface-based. Thus, this surface can either be provided by mechanical design, or created when reaction products from previous cycles are deposited within the equipment, e.g. the piping.

Conventional hot-traps require extensive and frequent cleaning and/or replacement which, due to the construction of the hot-trap, requires a considerable amount of time. This, in turn leads to a reduced uptime of the vacuum processing system and high maintenance costs. More importantly, with conventional hot-traps the reaction by-products and unreacted reagents flow through the hot-trap in a laminar fashion which results in an inhomogeneous concentration of said substances within the gas stream as no or little mixing occurs. Consequently, conventional hot-traps only provide sub-optimal reaction conditions. In addition, the concentration of reaction by-products and the unreacted reagents decreases within the hot-trap in the direction of the gas flow resulting in a change of optimal reaction parameters. Thus, conventional hot-traps do not offer ideal reaction conditions over their full length.

SUMMARY OF INVENTION

It is an object of the present invention to provide a hot-trap device for the easy, efficient and cost effective removal of reaction by-products and unreacted reagents from exhausted process gases that offers ideal reaction conditions to clean the exhausted gas from reaction by-products and the unreacted reagents.

This object is achieved by a vapor deposition hot-trap device comprising: an enclosure comprising at least one inlet and at least one outlet; at least one heating means; and at least one collector means for the conversion of reaction by-products into products that are deposited on the collector means and/or the inner surface of the enclosure, wherein the collector means is arranged within the enclosure between the inlet and the outlet and wherein the collector means has a diameter that substantially matches the diameter of the enclosure and has at least one opening.

Thus, the present invention is based on the central idea that a specific structural geometry of the collector means provides for a turbulent rather than a laminar flow of the exhaust gas evacuated/exhausted from the vacuum processing system and led through the hot-trap device. This decrease or complete elimination of the laminar flow advantageously results in an increased diffusion velocity of the reaction by-products and unreacted reagents from the bulk gas flow of the exhaust gas to the collector means. The special structural geometry of the collector means is achieved by the at least one opening through which the exhaust gas is led.

The hot-trap device of the present invention is, as explained above, used to clean gas exhausted from a vacuum processing system and remove or partially remove reaction by-products. The term "reaction by-products" as used herein also comprises unreacted reagents, preferably unreacted DEZ.

Furthermore, the hot-trap device of the present invention is a hot-trap device suitable for a vacuum processing system. In one embodiment, the hot-trap device is suitable for a module of a vacuum processing system, preferably an inline vacuum processing system. In another embodiment the vacuum processing system or module thereof is used for vapor deposition. In further embodiments the vapor deposition is selected from the group consisting of physical vapor deposition (PVD), chemical vapor deposition (CVD), low pressure CVD (LPCVD) or plasma enhanced CVD (PECVD). Preferably, the vapor deposition is LPCVD or PECVD.

In further preferred embodiments the vapor deposition is a deposition of silicon, silicon oxide or metal oxide, more preferably a deposition of ZnO or indium tin oxide (ITO). ZnO layers show premium performance as a conductive contacting material, e.g. for (thin film) solar cell applications. Most preferably the vapor deposition is a ZnO-LPCVD or ZnO-PECVD. In further preferred embodiments the vapor deposition is used for the production of thin films, preferably thin film transistors (TFTs) or transparent conductive oxide (TCO) layers.

In a further specific embodiment the hot-trap device of the present invention is suitable for vacuum processing system for CVD processing of substrates of a size of $\geq 1$ m$^2$, preferably thin glass plates.

The enclosure of the hot-trap device of the present invention is not restricted to a particular geometry but can have any shape that allows for the arrangement of the collector means inside the enclosure and between the inlet and the outlet of the enclosure so that the flow of gas entering the inlet and exiting the outlet is forced through the collector means. In specific embodiments the enclosure has the shape of a cylindrical pipe and/or the cross section of the enclosure is circular or square shaped. In a preferred embodiment the enclosure is a widened part of the piping connecting, for example, a PECVD module to the vacuum pump.

The enclosure comprises at least one inlet and at least one outlet that are arranged on each side of the collector means, respectively. In one embodiment the inlet is connected to a processing station or module of the vacuum processing system, while the outlet is connected to a vacuum pump. Preferably, the inlet is connected to a PECVD or LPCVD deposition module, more preferably for this module is used for the deposition of ZnO, Si, or SiO. In a further preferred embodiment, the inlet and outlet are arranged near the top and bottom, respectively of the enclosure. In a preferred embodiment, the enclosure comprises a single inlet and a single outlet. The inlets and outlets of the enclosure can have any suitable cross section and diameter that will depend on the throughput of the vacuum processing system.

In a further preferred embodiment, the enclosure further comprises at least one closable opening, e.g. a lid, or a cap, most preferably a blind flange. The closable opening allows for the cleaning of the inside of the enclosure by, e.g. a chemical treatment using mineral acids and the replacement of the collector means. More preferably, said closable opening is positioned at the top and/or bottom of the enclosure. Even more preferably the enclosure comprises two closable openings that are oriented opposite to each other, for example one forming the top and one forming the bottom of the enclosure. Such an arrangement allows for an easy rinsing of the enclosure, wherein the cleaning reagent, e.g. mineral acid, is introduced through the first opening, passes through the whole enclosure and exits through the second opening. In a further specific embodiment the enclosure and/or the closable openings is/are made of any suitable material that is able to withstand temperatures of $\geq 50°$ C. and $\leq 600°$ C. Preferably, the enclosure and/or the closable openings is/are resistant to chemical treatment, e.g. to treatment with mineral acids. Most preferably the enclosure and/or the closable openings is/are made of metal.

The enclosure comprises at least one heating means, preferably two heating means. In specific embodiments of the invention the heating means is at least one internal heating means and/or at least one external heating means. Most preferably, the enclosure comprises one internal and one external heating means, which allows for a reliable control of temperature. Internal heating means are arranged within the enclosure, while external heating means are arranged at the outside of the enclosure. In specific embodiments of the invention the heating means may deliver temperatures of $\geq 0°$ C. and $\leq 600°$ C., preferably $\geq 200°$ C. and $\leq 450°$ C. In a further preferred embodiment the internal heating means is a heating rod, more preferably an electrical heating rod. Preferably, the internal heating means is arranged in the center of the enclosure. In a further preferred embodiment the heating means extend over about the whole length of the enclosure, i.e. from the top to the bottom or almost the top to almost the bottom of the enclosure. More preferably, the internal heating means is connected to the closable opening and can be removed together with the lid of said closable opening. In a further embodiment the external heating means is a heating jacket. Preferably, the external heating means are wound with heat insulation band. More preferably, the enclosure is at least partly heat insulated to avoid a loss of energy. Most preferably, the enclosure is completely heat insulated.

In specific embodiments of the invention the internal heating means are directly thermally coupled or, preferably, indirectly thermally coupled to the collector means. As discussed below, the collector means may be arranged by means of spacers. The heating means can be in contact with said spacers and thus indirectly thermally coupled to the collector means contacting the spacers.

The hot-trap according to the invention further comprises at least one collector means for the conversion of reaction by-products—including unreacted reagents—into products that are deposited on the collector means and/or the inner surface of the enclosure, wherein the collector means is arranged within the enclosure between the inlet and the outlet. Furthermore, the collector means has a diameter that substantially matches the diameter of the enclosure and has at least one opening. As discussed above, the collector means are arranged within the enclosure and between the inlet and outlet of the enclosure. This way, gas entering the hot-trap through the inlet and exiting the hot-trap through the outlet is forced through the collector means. Thus, the collector means poses an obstruction to the stream of exhaust gas led through the hot-trap and the gas is required to pass the collector means by means of the opening. This advantageously results in the reduction of a laminar flow and a transition to a turbulent flow of the exhaust gas as explained above.

The collector means can be of any suitable geometry. In specific embodiments the collector means has the shape of a disk, a plate, a rectangular plate or a wheel. As described above, the collector means preferably has a diameter that substantially matches the inner diameter of the enclosure, i.e. the collector means tightly fits into the enclosure. However, the diameter of the collector means can also have a smaller diameter than the inner diameter of the enclosure. Preferably, the shape of the collector means complements the shape of the enclosure.

The openings within the collector means can generally be of any suitable shape and their size will be chosen to not obstruct the gas flow from the process chamber to the vacuum pump too much. Preferably, the openings have the form of slits, slots, circular openings, rectangular openings and/or circular sectors.

In a preferred embodiment the collector means has the shape of a wheel or disk and the openings are circular sectors. Thus, the "spokes" of the wheel-shaped collector means represent the surface area of the collector means. More preferably, the collector means has the shape of a wheel with $\geq 2$, $\geq 3$, $\geq 4$, $\geq 5$, $\geq 6$, $\geq 8$, $\geq 10$, or $\geq 12$, spokes, furthermore, these spokes are evenly distributed, i.e. the angle between each two spokes of a wheel is equal.

In a further specific embodiment, the collector means is made of a material that acts as a catalyst for the conversion of the reaction by-products. In another specific embodiment the collector means exhibits a chemically active and/or catalytic surface. In another specific embodiment the collector means is made of a material that exhibits a good thermal conduction, preferably a metal, more preferably aluminum. In a further specific embodiment the collector means is made of a ceramic material. In a preferred embodiment of the invention the collector means comprises silicon, silica ($SiO_2$), aluminum, aluminum oxide ($Al_2O_3$), copper, sodium oxide (NaO) or combinations thereof. More preferably, the collector means is made of a ceramic material that comprises $\geq 50$ wt % and $\leq 85$ wt % of $SiO_2$, and/or $\geq 15$ wt % and $\leq 50$ wt % of $Al_2O_3$. Even more preferably the collector means is made of a ceramic material that comprises $\geq 65$ wt % and $\leq 70$ wt % of $SiO_2$ or $\geq 23$ wt % and $\leq 28$ wt % of $Al_2O_3$, or combinations thereof. Most preferably, the collector means is made of a ceramic material that comprises $\geq 65$ wt % and $\leq 70$ wt % of $SiO_2$ and $\geq 23$ wt % and $\leq 28$ wt % of $Al_2O_3$. The material of the collector means may further comprise traces of other materials.

In another preferred embodiment the collector means has the shape of a wheel or disk and the openings are circular sectors and the collector means furthermore comprises additional collector means attached thereon. Preferably these additional collector means act as a catalyst. In an especially preferred embodiment the additional collector means comprise a material as detailed in the preceding paragraph. Even more preferably, the additional collector means are selected from the group consisting of 13 mm, 19 mm and/or 25 mm pentaring bed topping media commercially available from Saint-Gobain NorPro GmbH, Germany.

In another specific embodiment the collector means exhibits a physical and chemical stability at high temperatures, preferably at temperatures of $\geq 100°$ C. and $\leq 600°$ C., more preferably of $\geq 200°$ C. and $\leq 450°$ C.

In a preferred embodiment the deposition of the converted reaction by-products, e.g. Zn and/or ZnO, occurs primarily on the collector means and to a lesser extent on the inside surface of the enclosure. This has the advantage that a cleaning of the enclosure, for example by rinsing with mineral acids, is not or less frequently required. As discussed below, the collection means can be removed/replaced quicker and more easily. Therefore, in a preferred embodiment, the inner surface of the enclosure is small compared to the surface of the collector means.

In a specific embodiment of the invention the collector means is replaceable, i.e. it is not a part of the enclosure. This has the advantage that the collector means, upon saturation, can be removed and/or replaced easily and quickly. In turn, the maintenance time is decreased and the uptime of the vacuum processing system is increased. Furthermore, since no conventional hot-trap involving, e.g., mechanical constrictions which are part of the enclosing is used time-consuming cleaning steps are no longer necessary. In preferred embodiments the collector means is arranged or mounted on the central heating element.

In a further embodiment the hot-trap device of the present invention comprises $\geq 2$ collector means, preferably $\geq 3$, or $\geq 4$, most preferably $\geq 5$ collector means. The number of collector means will be chosen dependent on the concentration of the reaction product in the exhaust gas stream and dependent on the total exhaust gas volume. It has been shown that in conjunction with the TCO 1200 LPCVD system—that is commercially available from Oerlikon Solar—a number of 5 collector means yields the best results.

If more than one collector means is present, the collector means are arranged sequentially in the direction of the gas flow within the hot-trap. Preferably, the collector means are spaced, i.e. they are not in physical contact with each other. The spacing between a first set of two collector means and a second set of collector means can be the same, i.e. the distance between the first and the second collector means is equal to the distance between second and third collector means. Preferably, however, the spacing between a first set and a second set of two collector means is adjusted to compensate for the reduced concentration of reaction by-products in the exhaust gas stream in the direction of gas flow. In other words, the spacing between the collector means is reduced in the direction of gas flow, e.g. the spacing between the first and second collector means is larger than the spacing between the second and third collector means. Thus, the distance the exhaust gas needs to travel from a first collector means to the next collector means is advantageously reduced gradually. By such an arrangement of the collector means the efficiency of the hot-trap can be increased as the collection efficiency will be kept almost constant in the direction of gas flow.

The spacing between the collector means can be achieved by means of spacers and/or distance elements that separate the single collector means. Thus, in a preferred embodiment the hot-trap device of the present invention further comprises at least one spacer element arranged between two adjacent collector means to achieve the advantageous spacing of the collector means described above. The spacers can further be used to thermally couple the collector means to the internal heating means. Thus, the spacers are preferably made of thermoconductive material. In another preferred embodiment the spacers have the shape of bushings that are arranged on the central heating element, such as a heating rod.

In a further preferred embodiment of the invention the collector means and the spacers are arranged, i.e. mounted, on a common bushing or tube the inner diameter of which is slightly larger than the outer diameter of the central heating rod. This common tube is then imposed onto the heating rod. By this arrangement a quick and uncomplicated servicing of the hot-trap device can advantageously be achieved by exchanging the common bushing comprising the collector means and spacers, whereby the downtime of the system is shortened.

In another preferred embodiment of the invention the at least two collector means are arranged in a way so that their openings are staggered. In other words, the collector means are mounted with an offset to each other so that the openings of two adjacent collector means do not completely overlap. Advantageously such an arrangement results in an increased turbulent flow of the exhaust gas led through the hot-trap device of the present invention and consequently an increase in efficiency of the device as explained above.

In a further preferred embodiment the collector means are mounted with an offset to each other so that no direct passage over the full length of the hot-trap device is possible. For example, if three collector means are present and half of the area of the openings of the first collector means is covered by the second collector means then the third collector means must be arranged so that the remaining uncovered half of the area of the opening of the first collector means is covered by the third collector means.

In a further preferred embodiment of the invention the surface area of the collector means increases in the direction from inlet to outlet, i.e. in the direction of the flow of the exhaust gas. In other words, the overall surface area of the openings within the collector means decrease in the direction of the gas flow. As the reaction processes in the hot-trap device are surface limited this has the advantageous effect that the efficiency of the inventive hot-trap device is further increased. An increasing surface area along the way of the flow of the exhaust gas compensates for the reduced gas concentration inside the hot-trap device and thus allows for a homogeneous capturing efficiency along the full length of the device. By such means, a blockage at a distinct location of the hot-trap device is avoided while other parts of the device are not or not yet fully saturated.

In preferred embodiments of the invention the surface area of a second collector means directly adjacent to a first collector means is increased by $\geq 5\%$ and $\leq 150\%$, $\geq 10\%$ and $\leq 80\%$, more preferably $\geq 20\%$ and $\leq 50\%$.

In an especially preferred embodiment the hot-trap device comprises a set of five collector means with a wheel-like structure, wherein the first wheel comprises two evenly spaced spokes, i.e. collector areas, the second wheel comprises four evenly spaced spokes, the third wheel comprises six evenly spaced spokes, the fourth wheel comprises eight evenly spaced spokes and the fifth wheel comprises twelve evenly spaced spokes. The spokes have the shape of circular sectors and "evenly spaced" means an equal distribution of said circular sectors. For example, the spokes of the first wheel are directly opposing each other, i.e. the angle between the two spokes is 180°, while the spokes of the second wheel are arranged in a form representing a cross, i.e. the angle between each two spokes is 90°.

In a further preferred embodiment the temperature of the collector means increases in the direction from inlet to outlet, i.e. in the direction of the flow of the exhaust gas. In other words, the temperature of the collector means increases in the direction of the gas flow. As the reaction processes in the hot-trap device are temperature limited this has the advantageous effect that the efficiency of the inventive hot-trap device is further increased. An increasing temperature along the way of the flow of the exhaust gas compensates for the reduced gas concentration inside the hot-trap device and thus allows for a homogeneous capturing efficiency along the full length of the device. By such means, a blockage at a distinct location of the hot-trap device is avoided while other parts of the device are not or not yet fully saturated.

A temperature gradient along the collector means may be established by any suitable means known to the skilled person. In a preferred embodiment the collector means are stacked on a central heating rod, preferably an electrical heating rod. The heating rod may, for example, be heated only at one side or heated to different temperatures at the opposing sides. Alternatively or additionally, the heating rod may be wound with a heating wire with an increasing winding.

Importantly, the above described means—i.e. the staggering of the openings in the collector means, the surface area gradient, spacing between the single collector means, and the temperature gradient—to improve the reaction conditions and thus the efficiency of the hot-trap device can be employed combined or separately. It is thus for example possible to design the collector means and spacers identically and to establish a temperature gradient in such a way to achieve essentially homogeneous trapping efficiency of all collector means present in the hot-trap device. In another example the collector means are designed identically and the temperature is kept constant over the whole length of the hot-trap device, while the spacing between the collector means is adapted to achieve essentially homogeneous trapping efficiency of all collector means present in the hot-trap device. In even another example the staggering of the openings in the collector means, the surface area gradient, spacing between the single collector means, and the temperature gradient are employed in combination.

In a further embodiment the hot-trap device additionally comprises at least one means for the measurement of the temperature (e.g. a thermal sensor or a thermistor), preferably at different points in the hot-trap device. This has the advantage that the temperature conditions inside the hot-trap device can be monitored and kept up to the desired levels. Preferably, said means for the measurement of the temperature is arranged to measure the temperature within the enclosure or of the outer surface of the enclosure. More preferably, said means is arranged to measure the temperature of a collector means. Even more preferably, the means for the measurement of the temperature are used to control at least one of the heating means. In another preferred embodiment the means for the measurement of the temperature is mounted on the collector means closest to the outlet of the hot-trap device.

In a further aspect the invention is directed to a vacuum processing system comprising at least one processing module connected to at least one evacuation means and at least one hot-trap device according to the invention, wherein the hot-trap device is arranged upstream of the evacuation means.

In one embodiment the vacuum processing system is an inline vacuum processing system. In another embodiment the vacuum processing system or processing module thereof is used for vapor deposition. In further embodiments the vapor deposition is selected from the group consisting of PVD, CVD, LPCVD or PECVD. Preferably, the vapor deposition is LPCVD or PECVD. In further preferred embodiments the vapor deposition is a deposition of silicon, silicon oxide or metal oxide, more preferably a deposition of ZnO or indium tin oxide (ITO). Most preferably the vapor deposition is a ZnO-LPCVD or ZnO-PECVD. In further preferred embodiments the vapor deposition is used for the production of thin films, preferably thin film transistors (TFTs) or transparent conductive oxide (TCO) layers.

In further embodiments of the invention the evacuation means is an exhaust pump, a vacuum pump, a fore vacuum pump, a rotary vane pump, a roots pump, a high vacuum pump, an oil diffusion pump, a cryo pump, or a turbomolecular pump. In a preferred embodiment the evacuation means is a high vacuum pump, more preferably a turbomolecular pump that may achieve pressures $\leq 10^{-10}$ hPa.

The processing module, the evacuation means and the hot-trap device of the vacuum processing system need to be connected, preferably in line, wherein the hot-trap device is arranged upstream to the vacuum processing system and downstream to the processing module. The terms "upstream" and "downstream" are meant to refer to the direction of flow of the process gas evacuated from the processing module. In other words, the hot-trap device is arranged between the processing module and the evacuation means and process gas used in the processing module is evacuated from the processing module by the evacuation means, wherein the process gas first flows through the hot-trap device according to the present invention in order to remove the reaction by-products.

The connection of the components of the vacuum processing system of the present invention can be achieved by any suitable means known to the skilled allowing the process gas to be evacuated from the processing module and to be led through the hot-trap device to finally reach the evacuation means. Preferably, the components of the vacuum processing system are connected by pipes, vent lines and/or branch pipes.

In one embodiment $\geq 1$, $\geq 2$, or $\geq 3$ processing modules are evacuated by a single evacuation means, i.e. all of the processing modules are connected to a single evacuation means over $\geq 1$ hot-trap device. In another embodiment, $\geq 1$, $\geq 2$, or $\geq 3$ processing modules are evacuated by $\geq 2$ evacuation means, i.e. every single processing module may be evacuated by $\geq 1$ evacuation means and/or $\geq 2$ processing modules may be evacuated by $\geq 1$ evacuation means.

The connections between the components of the vacuum processing system can further comprise valves. Valves can advantageously be used to separate the components of the vacuum processing system from each other. This allows raising of the pressure within this/these separated devices without affecting the remaining vacuum processing system. In a further embodiment the hot-trap device(s) is/are separated from the processing module(s) by means of valves, preferably, $\geq 2$ valves per hot-trap device. In a preferred embodiment $\geq 1$ valve is positioned upstream to the hot-trap device and $\geq 1$ valve is positioned downstream to the hot-trap device. Thus, the at least one valve upstream to the hot-trap device separates the hot-trap device from the processing module and the at least one valve downstream to the hot-trap device separates the hot-trap device from the evacuation means.

In a further embodiment the valve is additionally connected to a further, preferably smaller, valve which advantageously allows for a soft pump of the vacuum processing system.

In another specific embodiment the vacuum processing system further comprises at least one means to measure the system pressure, preferably a pressure transducer. The means for measuring the system pressure can be arranged at any suitable position within the vacuum processing system.

In another specific embodiment the vacuum processing system further comprises at least one venting line arranged to vent the hot-trap device(s) to an atmospheric pressure level, once isolated by the valves. In a preferred embodiment, the venting is carried out with an inert gas, e.g. $N_2$.

In another specific embodiment the vacuum processing system further comprises at least one venting line arranged to vent the evacuation means by inserting a gas ballast. Thus, by means of this venting line the pressure inside the evacuation means can be controlled and care can be taken of the changing conductance due to the deposition inside the hot-trap devices which reduces the unrestricted cross section of the lines. In a preferred embodiment, the gas ballast is an inert gas, e.g. $N_2$.

A preferred embodiment of an inline vacuum processing system wherein the hot-trap device of the present invention may be used is the TCO 1200 LPCVD deposition system, available from Oerlikon Solar.

In another preferred embodiment the vacuum processing system comprises $\geq 2$ hot-trap devices according to the invention of which at least two are connected in parallel and thus located in at least two branches. In other words, the at least two parallel hot-trap devices are located in different branches and allow for the maintenance of a first hot-trap device, while the second hot-trap device takes over the function of the first hot-trap device and the vacuum processing system can be kept operational. Advantageously, such an arrangement of traps in parallel mode allows operating the vacuum processing system uninterruptedly, which significantly simplifies the maintenance, increases the lifetime of the evacuation means and improves uptime and cost efficiency of the overall production system.

Due to the comparably small volume of the parallel hot-trap devices the switchover from a first branch of the vacuum processing system to a second can be done in a very short time. Preferably this switchover is carried out in a time shorter than the transport time of the system. Thus, in an even more preferred embodiment, the switchover can be performed without interrupting the process of the vacuum processing system, preferably a deposition process.

In a more preferred embodiment, for each first hot-trap device present in the vacuum processing system a corresponding second hot-trap device is present that is connected in parallel with the first hot-trap device. In an even more preferred embodiment $\geq 1$ or each processing module is connected to $\geq 1$ pair of hot-trap devices connected in parallel. In another even more preferred embodiment, the CVD processing module(s) is/are connected to $\geq 1$ pair of hot-trap devices connected in parallel. Most preferably this/these CVD processing module(s) is/are a ZnO-LPCVD or ZnO-PECVD module(s).

In another preferred embodiment the vacuum processing system comprises more than two branches, each with a hot-trap device. Thus, more than two hot-trap devices are connected in a "revolver" mode design allowing for an improved use-to-maintenance ratio. This has the advantage that an automated fail-safe operation can be realized, e.g., by means of pressure transducers that monitor the system pressure in the respective vent line and will, via a control loop, allow automated switching between different branches. If more than two branches are present, the system will be able to react if a hot-trap device fails before its expected service time has been reached. Furthermore, if the hot-trap device has an automated self-cleaning cycle it may perform such while being isolated and hot-trap devices located in different branches are operational. Thus, a vacuum processing system with $\geq 2$ branches, each comprising at least one hot-trap device, will advantageously combine high availability with low maintenance and low downtime.

In a further aspect the invention is directed to a method for the removal of reaction by-products in a vacuum treatment system, wherein process gas comprising the reaction by-products is forced through at least one hot-trap device according to the present invention.

In a preferred embodiment the hot-trap device is comprised by a vacuum treatment system according to the invention.

In another preferred embodiment the hot-trap device is heated to a temperature of $\geq 200°$ C. and $\leq 450°$ C.

In another preferred embodiment the vacuum treatment system comprises at least two hot-trap devices that are connected in parallel and is operated continuously, i.e. the system is not brought down for maintenance.

BRIEF DESCRIPTION OF DRAWINGS

These and other aspects of the invention will be apparent from and elucidated with reference to the embodiments described hereinafter.

In the drawings.

DESCRIPTION OF EMBODIMENTS

Figure 1:
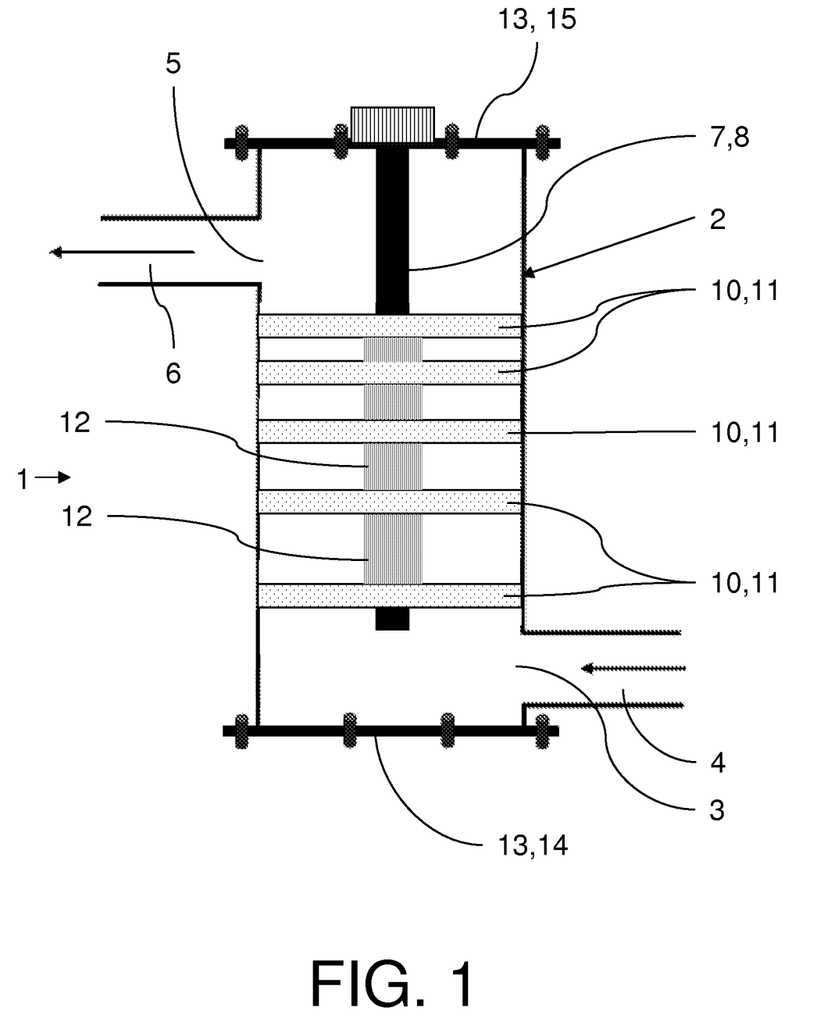
FIG. 1 shows a preferred embodiment of a hot-trap device according to the invention.

FIG. 1 shows a preferred embodiment of a hot-trap device 1 according to the invention. The hot-trap device comprises an enclosure 2 with the shape of a cylindrical pipe comprising an inlet 3 and an outlet 5. The inlet is connected to a ZnO-LPCVD processing module by means of a first piping 4, while the outlet is connected to a turbomolecular vacuum pump by a second piping 6.

Furthermore, the hot-trap device comprises a heating means 7 that is an internal heating means implemented as an electrical heating rod 8 that is arranged in the center of the enclosure and extends over about the whole length of the enclosure. The heating rod is used to apply a temperature gradient within the hot-trap device, wherein the collector means closest to the inlet has a lower temperature that gradually increases to a higher temperature of the collector means closest to the outlet. Furthermore, the hot-trap device comprises a heating jacket as an outer heating means 9 (not shown in FIG. 1).

The hot-trap device further comprises five collector means 10 in form of a wheel or disk 11 to convert the reaction by-products in the exhaust gas stream into products that can be retained within the hot-trap device. The wheels are arranged sequentially and are stacked by means of spacers 12. The length of the spacers increases in the direction from inlet to outlet of the hot-trap device, thus spacing the collector means with increasing distance.

The collector means 10 are made from aluminum and are mounted in a way so that they are flush with the inner wall of the enclosure 2. The collector means comprise openings to allow the exhaust gas to flow through them. Furthermore, the collector means are in direct thermal contact with the heating rod 8 and in indirect thermal contact with the heating rod via the spacers 12.

The hot-trap device further comprises two closeable openings 13 that are oriented opposite to each other. The bottom closeable opening is implemented as a blind flange 14. The top closeable opening 15 is implemented as a blind flange connected to the heating rod.

During operation of the vacuum processing system, the hot-trap device is heated to a temperature of about 450° C. from the inside utilizing the heating rod 8 and the heating jacket. A temperature measurement at different points in the hot-trap device is carried out to ascertain that the temperature conditions inside the hot-trap are up to desired levels.

As the vacuum pump is operated permanently process gas is evacuated from the ZnO-LPCVD processing module and drawn to the vacuum pump. As the hot-trap device is arranged between the ZnO-LPCVD processing module and the vacuum pump, process gas is forced through the hot-trap device (as indicated by the arrows), the openings of the trays and the collector means, respectively.

After the collector means 10 are saturated, the vacuum processing system is stopped and opened at the top 15 to allow removing of heating rod and collection means arranged thereon. Afterwards, the housing of the hot-trap device is cleaned/flushed with mineral acids to remove the deposition products. The bottom closeable opening 14 is opened to allow draining of the mineral acids.

Figure 2:
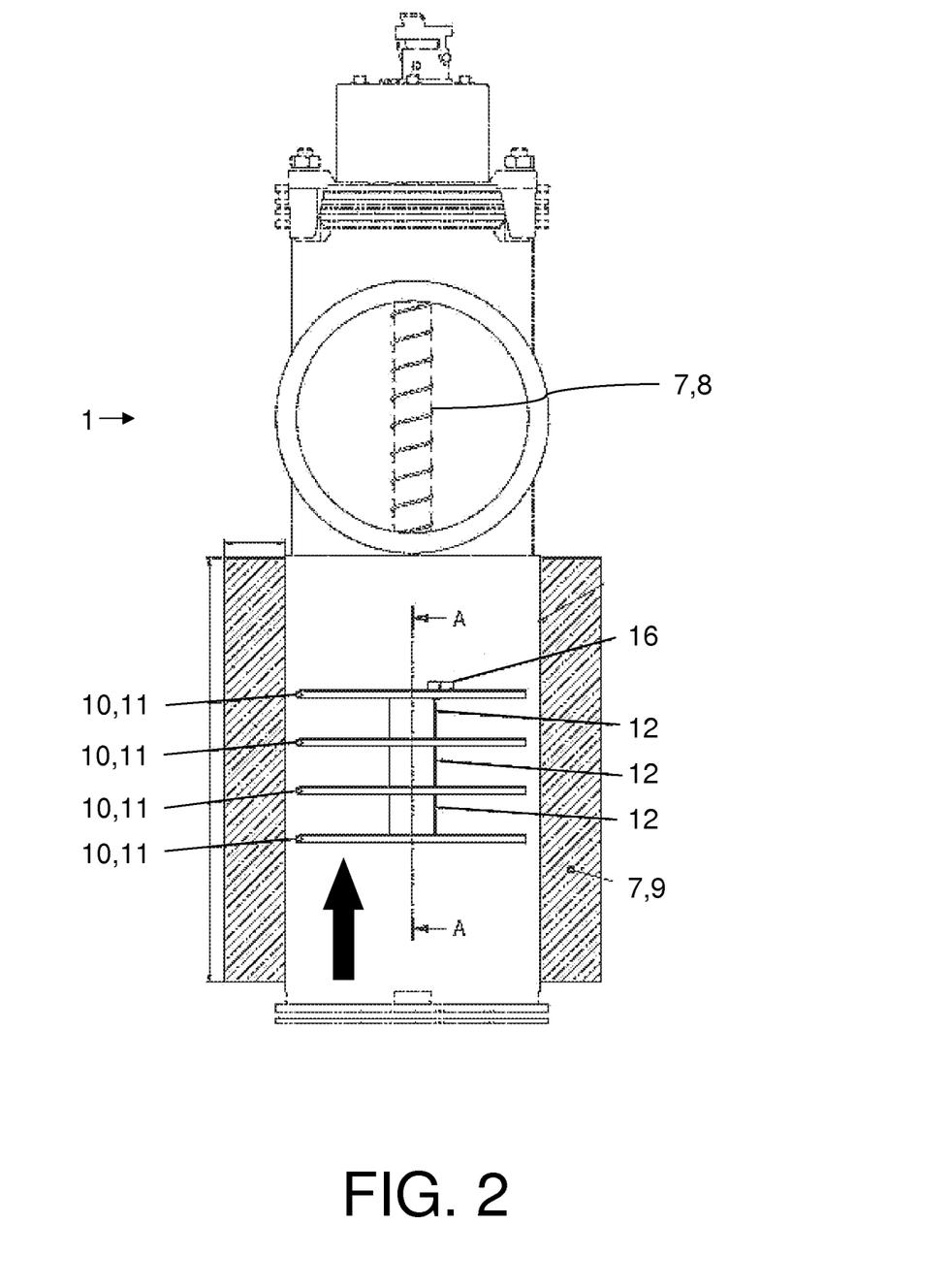
FIG. 2 shows another preferred embodiment of a hot-trap device according to the invention.

FIG. 2 shows a further preferred embodiment of a hot-trap device 1 according to the invention. The hot-trap device comprises four collector means 10 with a wheel-like shape 11 and is connecting a processing module to a vacuum pump. Thus, the inlet is connected to the ZnO-LPCVD processing module, while the outlet is connected to a turbomolecular vacuum pump.

Furthermore, the hot-trap device comprises two heating means 7. An internal heating means implemented as an electrical heating rod 8 that is arranged in the center of the enclosure along the axis A-A and extends over about the whole length of the enclosure is present. Furthermore, an external heating means 9 is present. The external heating means is implemented as a heating jacket and the enclosure is heat insulated to avoid a loss of energy.

The collector means 10 are separated by spacers 12 of identical length. Thus, the distance between any of the four collector means is equal. However, the surface area of the collector means increases in the direction of the gas flow indicated by the arrow. The increase in the surface area of the collector means is brought about by a decrease in the openings cut into the collector means. Furthermore, a temperature gradient is employed as described for FIG. 1 above.

The hot-trap device further comprises a thermocouple 16 as a means for the measurement of the temperature. Said thermocouple is mounted on the collector means closest to the outlet of the hot-trap device.

During operation of the vacuum processing system, the hot-trap device is heated to a temperature of about 450° C. from the inside utilizing the heating rod 8 and the heating jacket 9. A temperature measurement at different points in the hot-trap device is carried out to ascertain that the temperature conditions inside the hot-trap are up to desired levels.

As the vacuum pump is operated permanently process gas is evacuated from the ZnO-LPCVD processing module and drawn to the vacuum pump. As the hot-trap device is arranged between the ZnO-LPCVD processing module and the vacuum pump, process gas is forced through the hot-trap device (as indicated by the arrows), the openings of the cage and the collector means, respectively.

Figure 3:
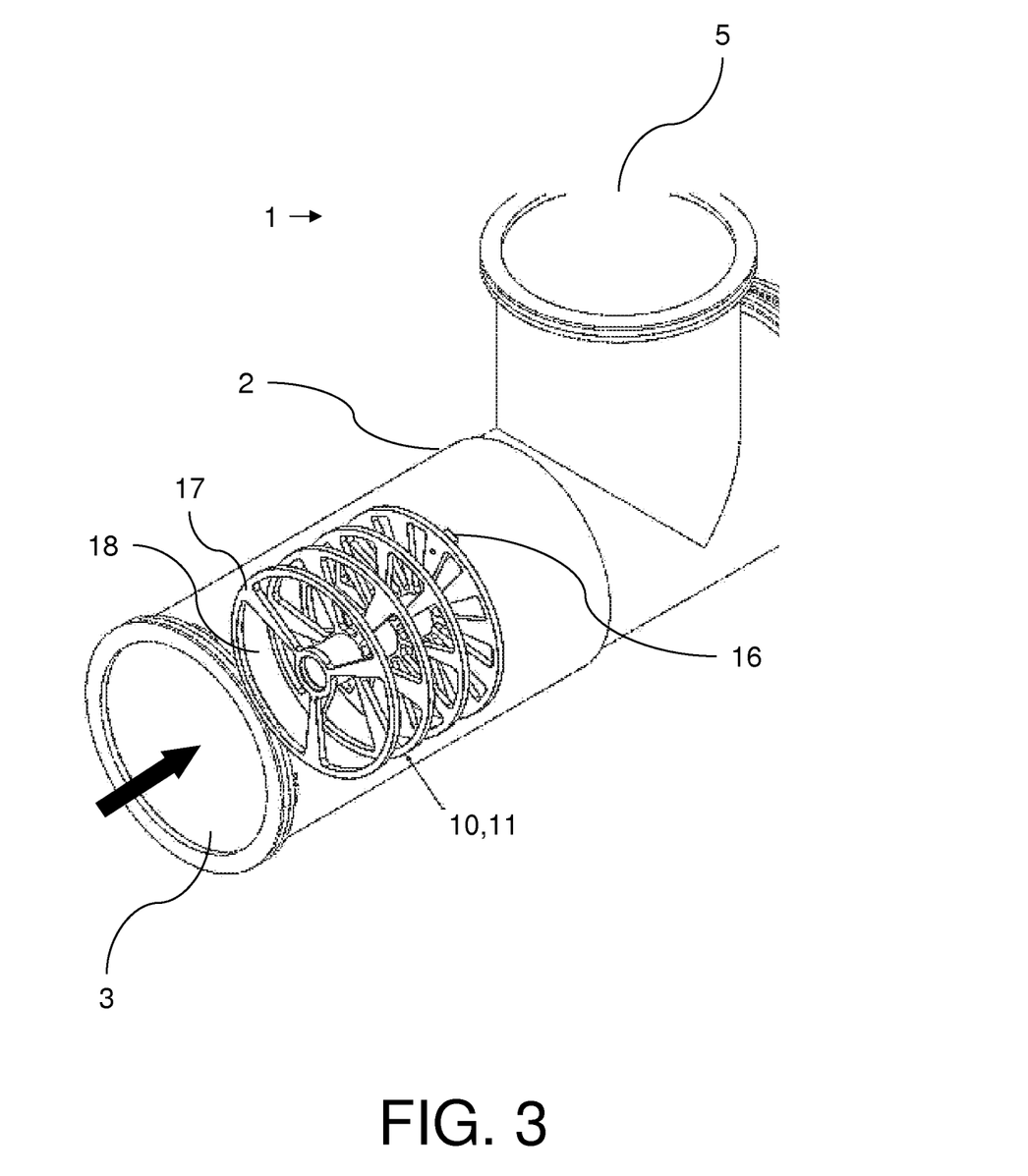
FIG. 3 shows another preferred embodiment of a hot-trap device according to the invention.

FIG. 3 shows a further preferred embodiment of a hot-trap device 1 according to the invention. The hot-trap device comprises an enclosure 2 with the shape of a cylindrical pipe comprising an inlet 3 and an outlet 5. The enclosure is implemented as is a widened part of the piping connecting a processing module to a vacuum pump. Thus, the inlet is connected to the ZnO-LPCVD processing module, while the outlet is connected to a turbomolecular vacuum pump.

The hot-trap device comprises four collector means 10 with a wheel-like shape 11 that are evenly separated by spacers 12.

The collector means comprise spokes 17 and openings 18 and the surface area of the collector means increases in the direction of the gas flow as indicated by the arrow. Thus, the collector means closest to the inlet 3 has the smallest surface area, while the collector means closest to the output 5 hast the largest surface area.

Figure 4:
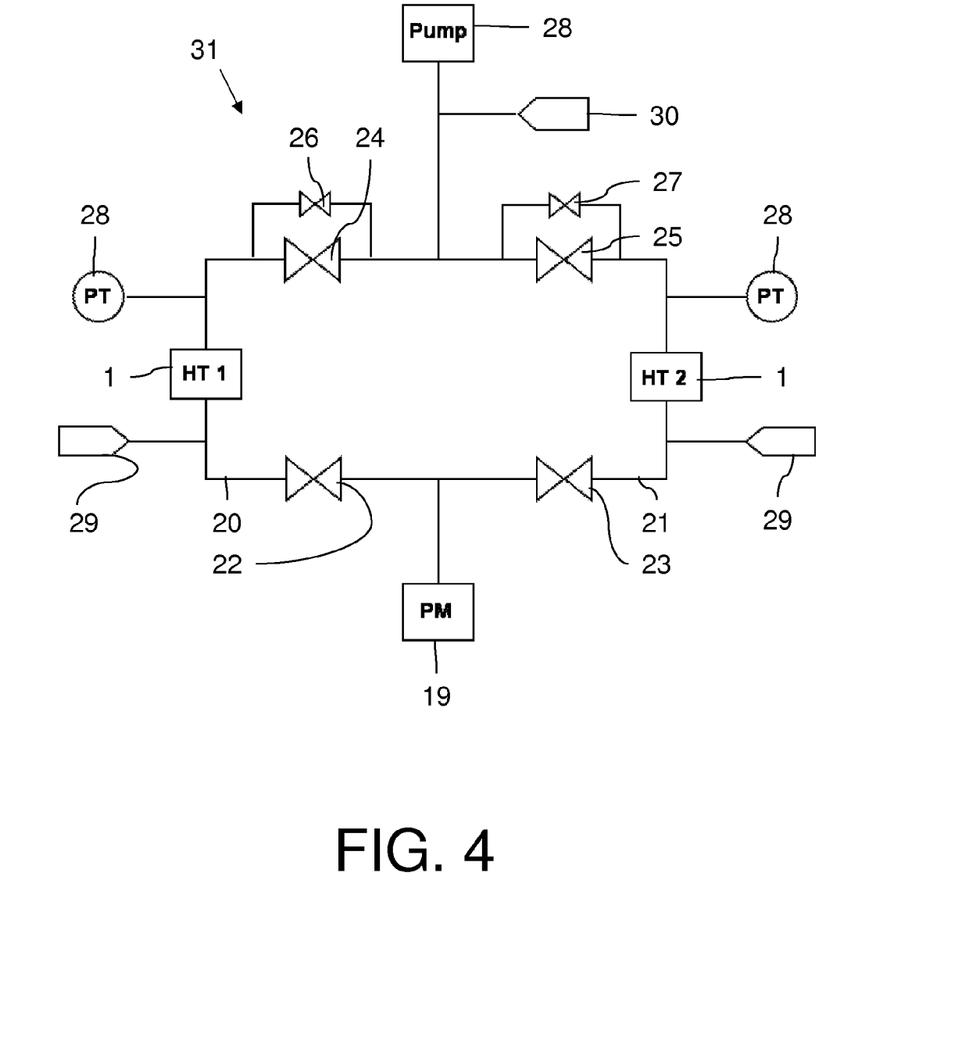
FIG. 4 shows a preferred embodiment of a vacuum processing system according to the invention.

FIG. 4 shows a preferred embodiment of a vacuum processing system 31 according to the invention. A process module (PM) 19 is connected via branch pipes 20, 21 and valves 22-27 to turbomolecular vacuum pump 28. Furthermore, a first and a second hot-trap device 1 according to the invention (HT1 and HT2) are present and are connected in parallel. Two main valves per branch 22, 24 for the first branch line 20 and 23, 25 for the second branch line 21 are used to separate the hot-trap devices from the process module and the pump on either side. The main valves 24, 25 on the side of the pump have smaller additional valves 26, 27 to allow for a soft pump of the system.

Additionally, pressure transducers (PT) 28 are used to monitor the system pressure. Furthermore a venting line 29, 30 on each branch line is present to allow venting of the hot-trap devices 1 with $N_2$ to atmospheric level after those have been isolated by the valves 22, 24 and 23, 25, respectively. A further venting line 30 is used for controlling the pressure in the vacuum pump line by adding $N_2$.

The method of operation comprises opening valves 22, 24 to pump down the process module and the vent lines including attached equipment. Valves 23, 25 and 27 remain closed to have a controlled conductance of the entire pump arrangement. The deposition process is run using hot-trap device HT1 to collect the effluent process gases as described above.

During operation, the hot-trap device HT2 in the second branch 21 can be serviced, exchanged or cleaned as it remains isolated due to the closed isolation valves 23, 25 and 27. Once serviced and installed, they can be brought to operational conditions. This comprises pump down sequences, bake out and/or cool down processes and alike.

As soon as trap HT1 is saturated and needs to be serviced, a switch over to the second branch 21 can be carried out, by opening the isolation valves 23, 25 and closing isolation valves 22, 24, 26. Now, the hot-trap device of the first branch 20 is isolated and can be serviced, while the second branch 21 is used to run the system.

Reference Signs List
1 hot-trap device
2 enclosure
3 inlet
4 first piping
5 outlet
6 second piping
7 heating means
8 heating rod
9 heating means
10 collector means
11 disk
12 spacer
13 opening
14 flange
15 opening
16 thermocouple
17 spoke
18 opening
19 processing module
20 first branch
21 second branch
22 closing isolation valve
23 isolation valve
24 closing isolation valve
25 isolation valve
26 closing isolation valve
27 isolation valve
28 pressure transducer
29 venting line
30 venting line
31 processing system

The invention claimed is:

1. A vapor deposition hot-trap device (1) comprising:
an enclosure (2) comprising at least one inlet (3) and at least one outlet (5);
at least one heating means (7); and
at least two collector means (10) for the conversion of reaction by-products into products that are deposited on the collector means (10) and/or the inner surface of the enclosure (2), wherein
the collector means (10) are arranged within the enclosure (2) between the inlet (3) and the outlet (5),
the collector means (10) have a diameter that substantially matches the diameter of the enclosure (2) and has at least one opening (18),
the collector means (10) are arranged in a way so that their openings (18) are staggered, and
the surface area of the collector means (10) increases in the direction from inlet (3) to outlet (5), wherein
the hot-trap device (1) further comprises a heating rod (8), and wherein the heating rod (8) is configured such that the temperature for the collector means (10) increases in the direction from inlet (3) to outlet (5).

2. The hot-trap device (1) according to claim 1, comprising at least two collector means (10) wherein the temperature of the collector means (10) increases in the direction from inlet (3) to outlet (5).

3. The hot-trap device (1) according to claim 1, comprising at least three collector means (10) wherein the distance between two consecutive collector means (10) decreases in the direction from inlet (3) to outlet (5).

4. The hot-trap device (1) according to claim 1, comprising a central internal heating means (8) thermally coupled to the collector means (10) and optionally comprising an external heating means (9).

5. The hot-trap device (1) according to claim 1, wherein the collector means (10) comprises silicon, silica, aluminum, aluminum oxide, copper, sodium oxide or combinations thereof.

6. The hot-trap device (1) according to claim 1, further comprising at least one means for the measurement of the temperature (16).

7. A vacuum processing system (31) comprising at least one processing module (19) connected to at least one evacuation means (28) and at least one hot-trap device (1) according to claim 1, wherein the hot-trap device (1) is arranged upstream of the evacuation means.

8. The vacuum processing system (31) according to claim 7, wherein ≧2 hot-trap devices are present of which at least 2 are connected in parallel.

9. The vacuum processing system (31) according to claim 8, wherein at least one processing module (19) is connected to ≧2 hot-trap devices that are connected in parallel.

10. The vacuum processing system (31) according, to claim 7 further comprising ≧2 valves, wherein ≧1 valve is positioned upstream to the hot-trap device (1) and ≧1 valve is positioned downstream to the hot-trap device.

11. The vacuum processing system (31) according to claim 7 further comprising at least one venting line (30) arranged to vent the hot-trap device (1) to an atmospheric pressure level.

12. The vacuum processing system (31) according to claim 7 further comprising a scrubbing-system connected to the evacuation means.

13. A method for the removal of reaction by-products in a vacuum processing system (31) according to claim 7, comprising the step of forcing process gas comprising the reaction by-products through the at least one hot-trap device (1).

* * * * *